United States Patent

Seager

[15] 3,697,783

[45] Oct. 10, 1972

[54] TRANSISTOR SWITCHING CIRCUITRY

[72] Inventor: Ronald W. Seager, Hamilton, Mass.

[73] Assignee: Raytheon Company, Lexington, Mass.

[22] Filed: April 29, 1971

[21] Appl. No.: 138,551

[52] U.S. Cl. ....................307/300, 307/254, 307/315

[51] Int. Cl. ..............................................H03k 17/60

[58] Field of Search ......343/854; 307/315, 311, 300, 307/254

[56] References Cited

UNITED STATES PATENTS

| | | | |
|---|---|---|---|
| 3,056,064 | 9/1962 | Bourget | 307/300 |
| 3,149,239 | 9/1964 | Weygang | 307/300 |
| 3,069,680 | 12/1962 | Seeley et al | 343/854 |

*Primary Examiner*—Stanley D. Miller, Jr.
*Assistant Examiner*—Harold A. Dixon
*Attorney*—Philip J. McFarland, Joseph D. Pannone and Richard M. Sharkansky

[57] ABSTRACT

Transistor switching circuitry, such circuitry including an input transistor and an output transistor coupled one to the other in a "Darlington" configuration is shown. The input transistor is coupled to a control signal source through a first gating arrangement and the output transistor is coupled to the control signal source through a second gating arrangement and a voltage storage element. The output transistor is driven "on" in response to a turning "on" signal from both the input transistor and the second gating arrangement. During the time the output transistor is "on," a voltage is stored by the voltage storage element, the level of such stored voltage approaching the voltage level of a voltage supply. When an "off" control signal is transmitted, the voltage storage element is coupled between the base-emitter electrodes of the output transistor, thereby rapidly to deplete the number of minority carriers in the output transistor and render it more quickly responsive to the "off" control signal.

4 Claims, 3 Drawing Figures

INVENTOR
RONALD W. SEAGER

INVENTOR
RONALD W. SEAGER

TRANSISTOR SWITCHING CIRCUITRY

BACKGROUND OF THE INVENTION

This invention pertains generally to transistor switching circuitry and more particularly to high speed switching circuitry wherein a transistor is rapidly switched from a saturation condition to a cutoff condition.

As is known in the art, transistor switching circuitry is employed in various electronic systems, including phased array antenna systems, such circuitry frequently requiring that a transistor employed therein be switched to an "on" or saturation condition or to an "off" or cut-off condition as rapidly as possible. As is also known, when a transistor is driven "on" minority carriers build up to a large level in the base-emitter junction region of such transistor. Because the transistor cannot be driven "off" until such large minority carrier density has been removed from such junction region, a relatively long delay may elapse before the transistor fully responds to an "off" command signal. This delay time in turning "off" a previously "on" transistor is, inter alia, a function of the current carrying capacity of the transistor. For example, in a phased array antenna system wherein each phase shifter element is driven by transistor switching circuitry, as output transistor employed by such circuitry may be required, when driven "on," to supply a current level of 6 amperes to a selected phase shifter element. Transistors capable of applying such a current level typically have a 300–400 nanosecond "off" delay time characteristic. Also, the variation in delay time from transistor to transistor may vary by more than 80–100 nanoseconds thereby reducing the accuracy of the phased array antenna when such system uses a flux drive or analog latching latch phase shifter technique as described in *Radar Handbook*, M.I. Skolnik, Mc-Graw Hill Book Company, New York, N.Y. 1970 pgs. 12–43 to 12–45.

One approach sometimes followed to remove the large number of minority carriers in the base-emitter junction region of a saturated transistor has been to employ a power supply of voltage polarity opposite to that polarity used to bias the transistors employed by a system, such supply being switched "in circuit" with the base and emitter electrodes of the output transistor at the time when such transistor is to be driven "off." Such an approach, however, has the undesirable shortcoming of requiring that the system employ two separate power supplies. Another approach, which requires only one power supply, is to provide a base resistor and capacitor circuit for coupling a control signal source to the base electrode of the output transistor, such circuit being responsive, when the transistor is driven "on," to cause a voltage to be built up across the capacitor. When an "off" control signal occurs, the capacitor is connected between the base electrode and the emitter electrode of the output transistor so that the minority carriers are discharged quickly through the capacitor. Obviously, however, such latter approach has the disadvantage that the level of voltage across the capacitor is limited to the level of voltage of the control signal driving the transistor "on." Such a limitation, in turn, may cause erratic operation of the output transistor.

Obviously, while it is desirable to drive a transistor "off" rapidly, it is also desirable to drive it "on" rapidly. As is known, transistor switching circuitry employed to supply current at levels required by phased array antenna systems generally include an input transistor and an output transistor coupled one to the other in a "Darlington" configuration. A control signal source is connected to the base electrode of the input transistor whereby the output transistor is driven "on" in response to the input transistor's response to an "on" control signal. This arrangement, however, has been found to result in a turn "on" delay time, for the output transistor, that is in excess of that required for high accuracy phased array antenna systems.

SUMMARY OF THE INVENTION

It is, therefore, a primary object of the invention to provide improved transistor switching circuitry capable of switching a transistor employed therein to an "on" condition or to an "off" condition with minimum delay time.

It is a further object of the invention to provide improved transistor switching circuitry employing a voltage storage element adapted to be connected between the base-emitter electrodes of a transistor incorporated in such circuitry when such transistor is to be switched from an "on" condition to an "off" condition, the level of the voltage stored by such storage element being independent of the voltage level of a control signal used to drive such transistor "on."

These and other objects of the invention are attained generally by providing an input transistor and an output transistor, such output transistor being coupled to a control signal source via a first and a second path, the first path including the input transistor and providing a direct way to couple both "on" and "off" control signals to such output transistor and the second path including switching means responsive to an "off" control signal to connect a back bias voltage from a power supply across the base and emitter electrodes of the output transistor, thereby rapidly to deplete the number of minority carriers in such transistor and render it more quickly responsive to the "off" control signal.

BRIEF DESCRIPTION OF THE DRAWINGS

For a more complete understanding of the invention reference is now made to the following description of the accompanying drawings in which.

DESCRIPTION OF THE PREFERRED EMBODIMENT

Figure 1:
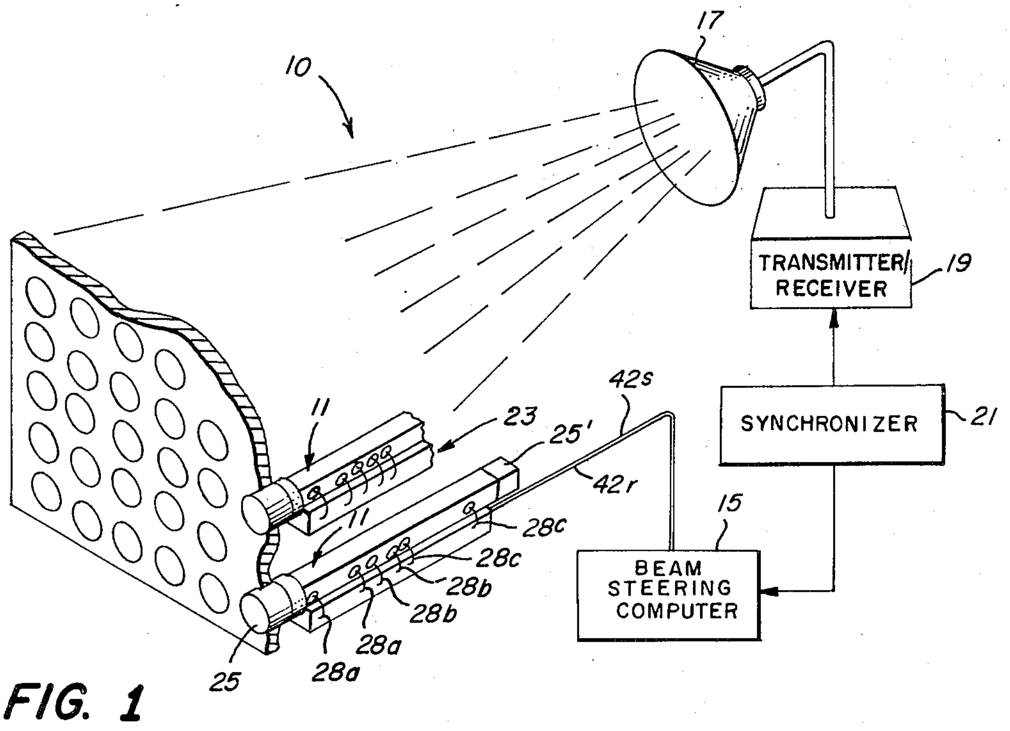
FIG. 1 is a simplified sketch of a radar system using an array of radiating elements, each one thereof being connected to a ferrite phase shifter element which is driven by drive circuitry according to this invention, to radiate a collimated beam of radio frequency energy and to receive echo signals from targets illuminated by such radiated energy.
Figure 2:
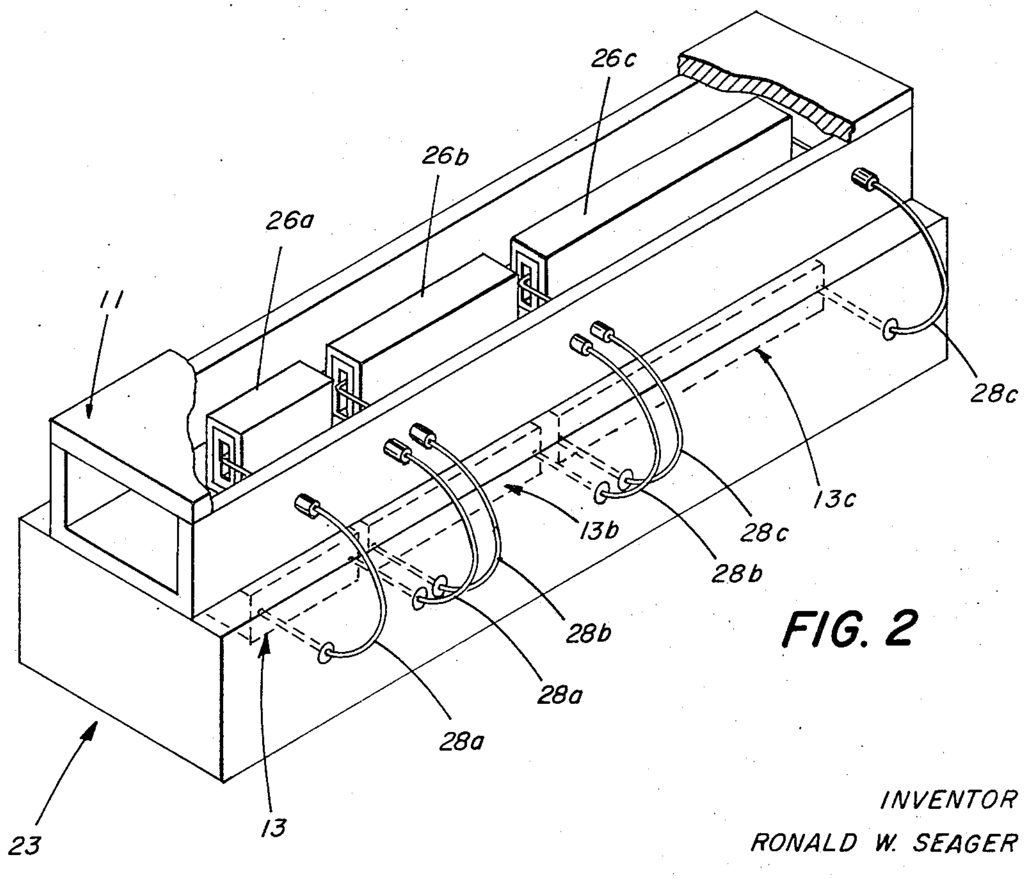
FIG. 2 is a cross-section of a ferrite phase shifter element of the type shown in FIG. 1.

Referring now to FIG. 1, it may be seen that an antenna 10 according to this invention includes a number of phase shifter elements 11, each such element having associated therewith a current driving circuitry 13. The phase shifter elements 11 and associated current driving circuitry 13 may be mounted in a conventional manner (not shown in detail) to form a space-fed planar array. Appropriate connections are made as indicated between each current diving circuitry 13 and the conductor for each ferrimagnetic toroid (shown in FIG. 2) of each phase shifter element 11 to drive each phase shifter element 11 in accordance with digital control signals from a beam steering computer 15. As is known, such an arrangement permits radio frequency energy from a feed horn 17 to be collimated and directed in a beam as desired and echo signals returning to the individual phase shifters of the antenna array to be focused on the feed horn 17. The feed horn 17 is connected in any convenient manner, as by waveguide (not numbered), to a transmitter/receiver 19. The operation of the transmitter/receiver 19 and the beam steering computer 15 is controlled by a conventional synchronizer 21.

Each one of the phase shifter elements 11 includes a section of waveguide 23 with the ends (not numbered) thereof matched to free space by conventional matching devices 25, 25′. In the particular embodiment illustrated, each one of the phase shifter elements 11 includes three serially arranged ferrimagnetic toroids 26*a*, 26*b*, 26*c* (FIG. 2) to operate in response to a three-bit control signal. Obviously, however, the number of toroids may be changed without departing from any inventive concepts. A different bit of a three bit control signal is applied to a different one of three identical current drivers 13*a–c* which together make up the current driving circuitry 13. A different one of the current drivers 13*a–c* is coupled to a different one of the ferrimagnetic toroids 26*a–c* via current drive cables 28*a–c*.

Figure 3:
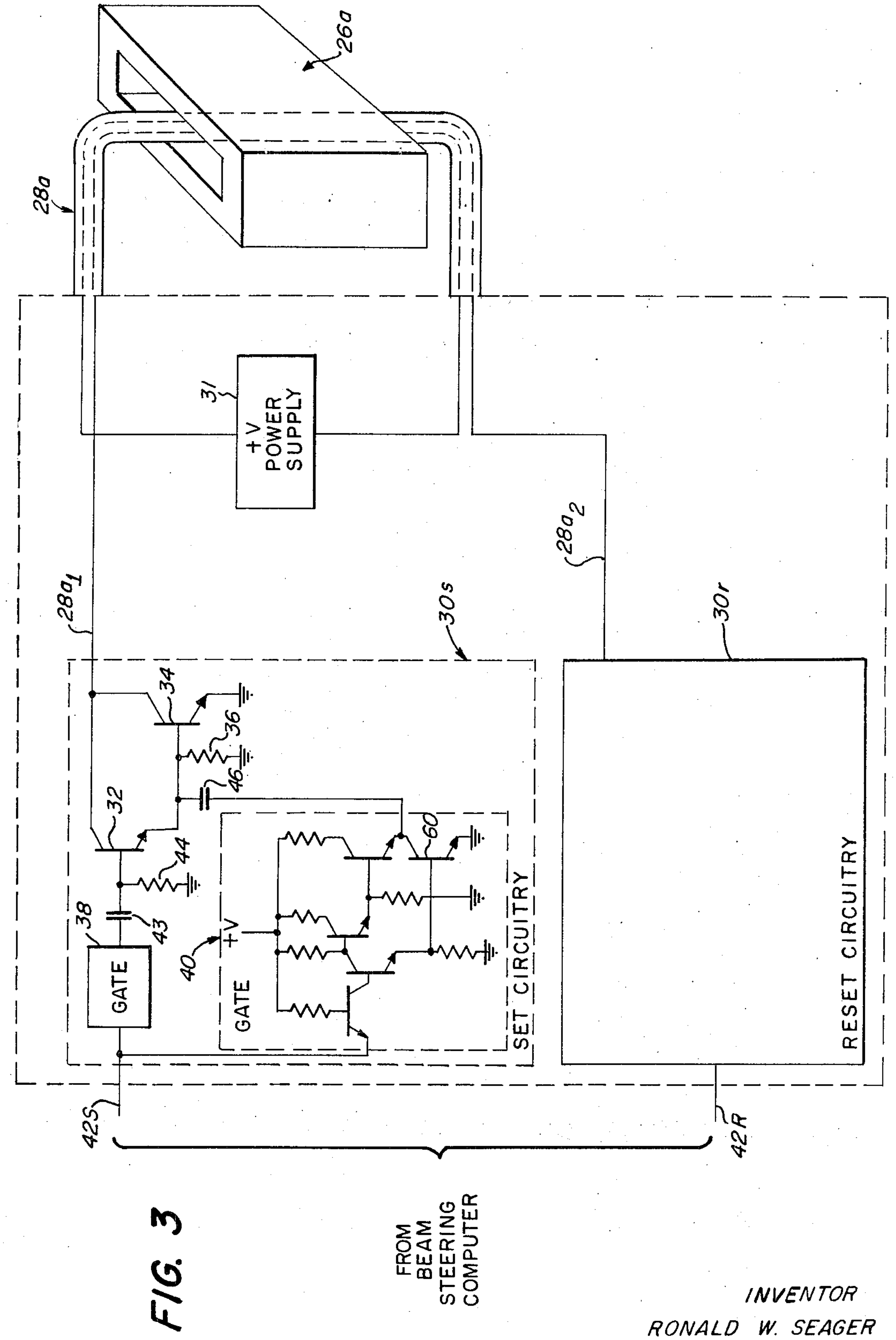
FIG. 3 is a schematic diagram of a current driver circuit embodying the invention, such circuit being adapted to drive a ferrimagnetic toroid employed by the phase shifter element shown in FIG. 2.

Referring now also to FIG. 3, an exemplary one of the current drivers 13*a–c* (here current driver 13*a*) is shown. It may be seen that the beam steering computer 15 transmits one bit of each one of the control signals to current driver 13a via either line 42*s* or 42*r*. That is, a "set" signal is transmitted on line 42*s* and a "reset" signal is transmitted on line 42*r*. Exemplary current driver 13*a* is comprised of set circuitry $30_s$ and reset circuitry $30_r$, each such circuitry being identical in construction and connected to lines $42_s$ and $42_r$, respectively, and powered by a power supply 31, marked "+V." Because set circuitry $30_s$ and reset circuitry $30_r$ are of identical construction, only set circuitry $30_s$ will be described in detail. Thus circuitry $30_s$ is seen to be made up of an input transistor 32 and an output transistor 34, connected as shown in a "Darlington" arrangement, the collector electrodes of such transistors being connected as shown to form line $28a_1$. Line $28a_1$, contained in cable 28*a*, is connected to the power supply 31. It is noted here in passing that, for reasons to become apparent, any current flowing from the power supply 31 to set circuitry $30_s$ via line $28a_1$ will flow through ferrimagnetic toroid 26*a*, here, in an upward direction, whereas any current flowing from such power supply to reset circuitry $30_r$ or via line $28a_2$ will flow through such toroid 26*a* in a direction opposite from that flow through line $28a_1$, that is, here in a downward direction. The emitter electrode of transistor 34 is connected to ground potential. The base electrode of transistor 34 is connected to: (a) the emitter electrode of transistor 32; (b) ground potential via a resistor 36; and (c) ground potential via transistor 60. Gates 38 and 40, the details of which will be described, respectively couple line 42*s* to the base electrode of input transistors 32 and output transistor 34, as indicated. In particular, the base electrode of input transistor 32 is connected to gate 38 through a differentiator made up of capacitor 43 and resistor 44, as shown. Gate 40 is connected to the base electrode of output transistor 34 via a voltage storage element, here capacitor 46. Gates 38 and 40 are identical in construction and are here shown as conventional T-T-L gates powered by the supply 31. In operation, when a "set" signal is applied to line 42*s*, gates 38 and 40 supply a positive voltage from the power supply 31 to drive both transistors 32 and 34 into saturation. The duration of such positive voltage is such that current flowing through line $28a_1$ drives ferrimagnetic toroid 26*a* into its "set" saturation condition. It is here noted that the time constant of capacitor 43 and resistor 44 is larger than the time constant of capacitor 46 and resistor 36. The former time constant is such that the voltage on the base electrode of input transistor 32 is sufficient to maintain input transistor 32 and output transistor 34 "on" for the time required to "set" saturate ferrimagnetic toroid 26*a*. The time constant of the latter is such that capacitor 46 becomes substantially fully charged to a voltage level dependent on the voltage level of the power supply 31 during such required time. The polarity of such voltage is such that a more negative potential is stored on the capacitor electrode connected to the base electrode of transistor 34. When it is desired to drive the ferrimagnetic toroid 26*a* into a "reset" saturated condition, a reset signal is supplied to line 42*r* so that current flows through line $28a_2$ and the "set" signal is removed from line 42*s*. As is well known, output transistor 34 will be held in a saturated condition until the minority carriers stored in the base-emitter junction of output transistor 34 have been reduced substantially. Also, it is noted that the current supplied by gate 40 is significantly lower than that supplied by output transistor 34, and therefore the transistors employed by such gate inherently operate more quickly than output transistor 34. It is further noted that, because the polarity of the voltage stored on capacitor 46 is such that the base electrode of transistor 34 then negative with respect to the emitter electrode thereof, the minority carriers are discharged. Therefore, when the "set" signal is removed from line 42*s*, transistor 60 will turn "on" and the base-emitter electrodes of transistor 34 will have connected therebetween a voltage supply (i.e., the voltage stored by capacitor 46) of proper voltage polarity to rapidly remove the minority carriers stored in the base-emitter junction region of transistor 34 and switch such transistor "off."

Numerous variations in the described embodiment, within the scope of the appended claims, will occur to those skilled in the art. For example, while a digital arrangement has been described, the current driver can be used in an analog arrangement. Also, while a ferrimagnetic toroid phase shifter was employed in the described embodiment, other types of phase shifters, such as a Faraday rotation phase shifter, may be employed. It is felt, therefore, that the invention should not be limited in scope to the particular embodiment here shown, but rather by the spirit and scope of the appended claims.

What is claimed is:

1. Transistor switching circuitry comprising: an output transistor having an emitter electrode, a collector electrode coupled to a load and a base electrode coupled to a source of binary signals through a first and second path, such first path including means for driving such output transistor in accordance with binary signals and the second path including switching means responsive to the binary signals for coupling a power supply to the base electrode in response to a first state of the binary signals and for coupling the base electrode to the emitter electrode in response to a second state of the binary signals, such second path including additionally a voltage storage element disposed between the switching means and the base electrode, such voltage storage element being coupled to the power supply when the switching means responds to the first state of the binary signals and being coupled between the base electrode and the emitter electrode when the switching circuitry responds to the second state of the binary signals.

2. The transistor switching circuitry recited in claim 1 wherein the voltage storage element is a capacitor.

3. The transistor switching circuitry recited in claim 1, including an input transistor, disposed in the first path, such input transistor having a base electrode coupled to the source of binary control signals, an emitter electrode coupled to the base electrode of the output transistor and a collector electrode coupled to the collector electrode of the output transistor.

4. The transistor switching circuitry recited in claim 3 including a differentiator disposed in the first path, such differentiator having an input terminal coupled to the computer and an output terminal coupled to the base electrode of the input transistor.

* * * * *